United States Patent [19]

Madaffari et al.

[11] Patent Number: 5,097,224

[45] Date of Patent: Mar. 17, 1992

[54] SELF-BIASING, LOW NOISE AMPLIFIER OF EXTENDED DYNAMIC RANGE

[75] Inventors: Peter L. Madaffari, Camden, Me.; Michael J. Wurtz, Edina, Minn.

[73] Assignee: Telex Communications, Inc., Minneapolis, Minn.

[21] Appl. No.: 684,020

[22] Filed: Apr. 11, 1991

[51] Int. Cl.$^5$ ............................................. M03F 3/16
[52] U.S. Cl. ..................................... 330/277; 330/296; 381/120
[58] Field of Search ............... 330/277, 292, 296, 300; 381/113, 120, 121, 122

[56] References Cited

U.S. PATENT DOCUMENTS

| | | | |
|---|---|---|---|
| 3,286,189 | 11/1966 | Mitchell et al. | 330/18 |
| 3,300,585 | 1/1967 | Reedyk et al. | 179/1 |
| 3,512,100 | 5/1970 | Killion et al. | 330/38 |
| 3,595,998 | 7/1971 | Baden et al. | 179/1 A |
| 3,678,402 | 7/1972 | Tempel | 330/9 |
| 3,862,367 | 1/1975 | Kono et al. | 179/1 A |
| 3,913,024 | 10/1975 | Necoechea | 381/121 X |
| 3,944,756 | 3/1976 | Lininger | 179/111 E |
| 3,993,869 | 11/1976 | Kono et al. | 179/1 A |
| 4,151,480 | 4/1979 | Carlson et al. | 330/277 |
| 4,214,215 | 7/1980 | Mellen et al. | 330/277 |
| 4,498,058 | 2/1985 | Benrud | 330/300 |
| 4,629,910 | 12/1986 | Early et al. | 307/317 |

OTHER PUBLICATIONS

Nakamura, J., and Wakabayashi, R.; "A Transistorized Amplifier for a Condenser Microphone", Journal of the Audio Engineering Society, vol. 15, No. 2, Apr., 1967, p. 200.

Primary Examiner—Steven Mottola
Attorney, Agent, or Firm—Joseph F. Breimayer

[57] ABSTRACT

An audio frequency amplification circuit for use with low level, high impedance signal sources, such as a miniature electret microphone, particularly useful where the power supply range is variable or may be limited to a single cell. The preferred embodiments of the circuit include a field effect transistor preamplifier stage operating as a voltage follower which is biased by a first and second impedance network coupled to the gate electrode of the FET transistor. A first impedance network is coupled between the power source terminals to provide a floating bias point. A second, high impedance network comprising (in one embodiment) a pair of parallel, reverse oriented diodes and a high impedance resistor is coupled between the bias point and the gate terminal of the transistor. In a further embodiment, the first impedance network comprises series connected high impedance resistors, and the second impedance network includes only the parallel, reverse oriented diodes. In either embodiment, extremely low capacitance elements may be coupled across the high impedance resistors, the elements preferably comprising stray capacitance from circuit conductor layout. Such source-follower biasing networks provides high input impedance and extended dynamic range without introducing noise or distortion. The audio frequency amplification circuit is preferably used as the preamplifier stage of a miniature electret microphone of extremely low source capacitance and mounted within the microphone in close proximity to the electret. Such a miniaturized, wide dynamic range microphone is especially adapted for use mounted on acoustic or electric musical instruments.

10 Claims, 2 Drawing Sheets

SELF-BIASING, LOW NOISE AMPLIFIER OF EXTENDED DYNAMIC RANGE

BACKGROUND OF THE INVENTION

1. Field of the Invention

This invention relates to the field of audio frequency amplification circuits employing field effect transistors as the preamplifier stage for a microphone, preferably an electret microphone.

2. Description of the Prior Art

The use of field effect transistors in audio frequency amplification circuits, particularly preamplifier circuits for high impedance audio signal sources, is well known. Field effect transistor circuitry has been employed in electret and condenser microphone and hearing aid design since the field effect transistor was first invented. For example, U.S. Pat. Nos. 3,512,100 and 4,151,480 and the article entitled "A Transistorized Amplifier for a Condenser Microphone" by Nakamura, et al, appearing in the *Journal of the Audio Engineering Society*, Vol. 15, No. 2, April 1967, p. 200, disclose various FET preamplifier circuits which generally provide high input impedance and fairly substantial gain.

The '100 patent describes the use of a biasing resistor or pair of parallel but opposed diodes connected between the gate of the FET transistor and the ground terminal of the circuit and power source which, as explained in the '100 patent, reverse bias the gate of the FET and in effect load the microphone input signal at the gate. The diodes also provide a circuit for bleeding off gate leakage and improve the circuit's transient response by dissipating charge between the gate and source of the FET transistor caused by high amplitude output signals of the microphone.

The '480 patent represents an improvement to the '100 patent circuit by the introduction of a second FET transistor functioning as a load in the source to-ground path of the amplifying FET transistor.

The Nakamura article describes the use of a potential dividing biasing network for providing a bias potential to add a voltage less than the output voltage of the voltage source and reaches certain conclusions about the relative bias and source impedance values.

The transducer that Nakamura describes is a condenser microphone using an external source for the polarizing potential as shown in FIG. 4 of the Nakamura article. The series resistance in the polarizing supply acts to limit current, but it is a source of noise. For an electret condenser microphone, no external supply or resistor is needed for the electret itself. Furthermore, for the FET used by Nakamura, the leakage current was 30 pa. For present day devices, with gate-drain voltages under 15 v, it is possible to have leakage currents of about 1 pa. Therefore, the shot noise is greatly decreased over that in the Nakamura circuit. Consequently, the primary noise of preamplifier stage sudio amplifiers used with a modern electret based consenser microphone is the noise produced by the gate resistor. To decrease the noise introduced by the amplifier, it is necessary to make the gate resistor as large as possible.

It may appear from the Nakamura article that a resistor from the gate capacitively coupled to the source will reduce the noise at the input because of "bootstrapping." This confusion arises because for the RC time constant of the input, the effective input impedance is raised and the corner frequency for rolloff is reduced as if a much higher resistor had been used. However, this circuit arrangement very effectively couples the noise of the actual input resistor between the gate and source through the capacitors shown in FIGS. 2 and 4 of the Nakamura article. For this noise, the FET is actually in the common source, not common drain configuration. For a common source amplifier, the voltage gain is greater than unity. The net effect is that the noise referred to the input is at best unchanged. With poor choices for the elements, it is actually increased.

Consequently, it appears that Nakamura did not intend the use of feedback to prevent overload or clipping; his intent appears to be only to prevent a low frequency rolloff.

There is a further drawback to Nakamura's approach—the need for a large value of coupling capacitor to achieve the necessary feedback. The impedance of the coupling capacitor must be less than the parallel combination of the bias resistors if it is to be effective. Using two 1 megohm resistor down to a frequency of 10 Hertz would require a 0.03 fd capacitor. The intent of the audio amplifier circuit of the present invention is to use it inside a very small lapel microphone which would be frustrated by such a large capacitor.

Improvements in the miniaturization of electret microphones which are capable of faithfully transducing a wide frequency and dynamic range of audio signals into electrical signals have outstripped improvements in the preamplifier amplification stage. It has been found desirable to employ the improved miniaturized electret microphone in conjunction with and mounted on acoustic and electric musical instruments which generate high dynamic acoustic signals. The electret microphone in turn generates electrical input signals to the FET preamplifier stage which must respond to and faithfully reproduce a wide dynamic range without clipping.

SUMMARY OF THE INVENTION

It is accordingly an object of the present invention to provide an audio frequency amplification circuit, particularly a preamplifier stage, which is capable of faithfully amplifying a wide dynamic range input signal from a microphone transducer without introducing clipping or distortion of the signal.

It is a further object of the present invention to employ such an improved circuit in conjunction with and mounted within the housing of a miniaturized electret microphone suitable to be used in conjunction with a musical instrument.

These and other objects of the present invention are realized in an audio frequency amplification circuit for use with a low level, high impedance, signal source comprising a field effect transistor having one terminal connected to one pole of a power source, a second terminal of the FET connected to one terminal of a bias means; and a third terminal connected by a load impedance to the other pole of said power source; a signal source having one output terminal connected to said second terminal of said FET and another side connected to said other side of said power source; and bias means coupled to said power source poles and said second terminal of said transistor for providing a high dynamic range of amplification of signals generated by said signal source without introduction of noise or distortion comprising in a first embodiment: a first impedance network coupled between said first and second terminals of said power source for providing a floating bias point between ground and said power source voltage; and a second high impedance network coupled between said second electrode of said transistor and said bias point comprising at least two diodes connected in parallel, said diodes being respectively connected with a polarity to pass current in relatively opposite directions, and a high impedance resistor in series with the two diodes.

In a second embodiment, the first impedance network comprises a pair of high impedance resistors in the giga-ohm range, and the second impedance network comprises only the two parallel connected diodes.

In addition, the impedance networks may include very low capacitance elements (preferably formed by the printed circuit conductor layout designed to introduce low capacitance) across certain of the high impedance resistors for decreasing noise at certain operating frequencies.

BRIEF DESCRIPTION OF THE DRAWINGS

The foregoing and other features, objects and advantages of the present invention are apparent from the following more particular description of the preferred embodiment of the invention as illustrated in the accompanying drawings wherein.

DESCRIPTION OF THE PREFERRED EMBODIMENTS OF THE INVENTION

Figure 1:
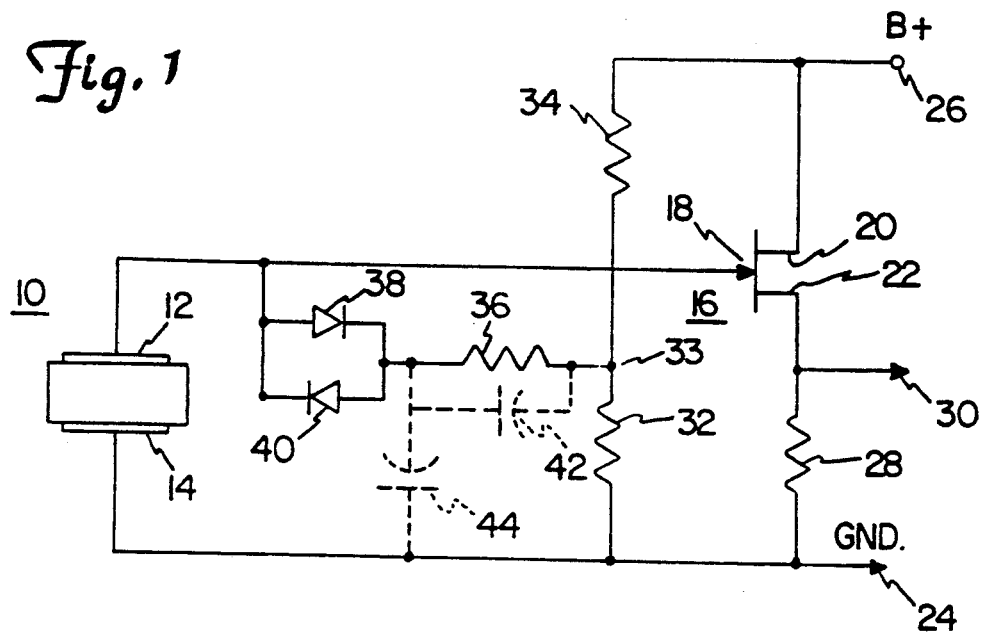
FIG. 1 is a schematic diagram of first and second embodiments of the improved audio frequency amplification circuit of the present invention.
Figure 2:
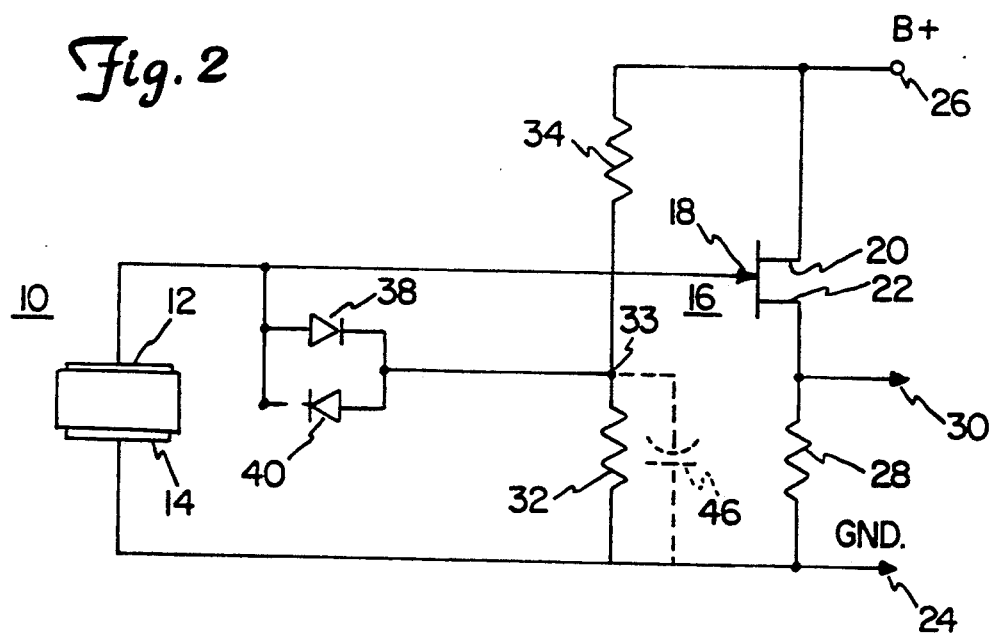
FIG. 2 is a schematic diagram of a third embodiment of the improved audio frequency amplification circuit of the present invention.
Figure 3:
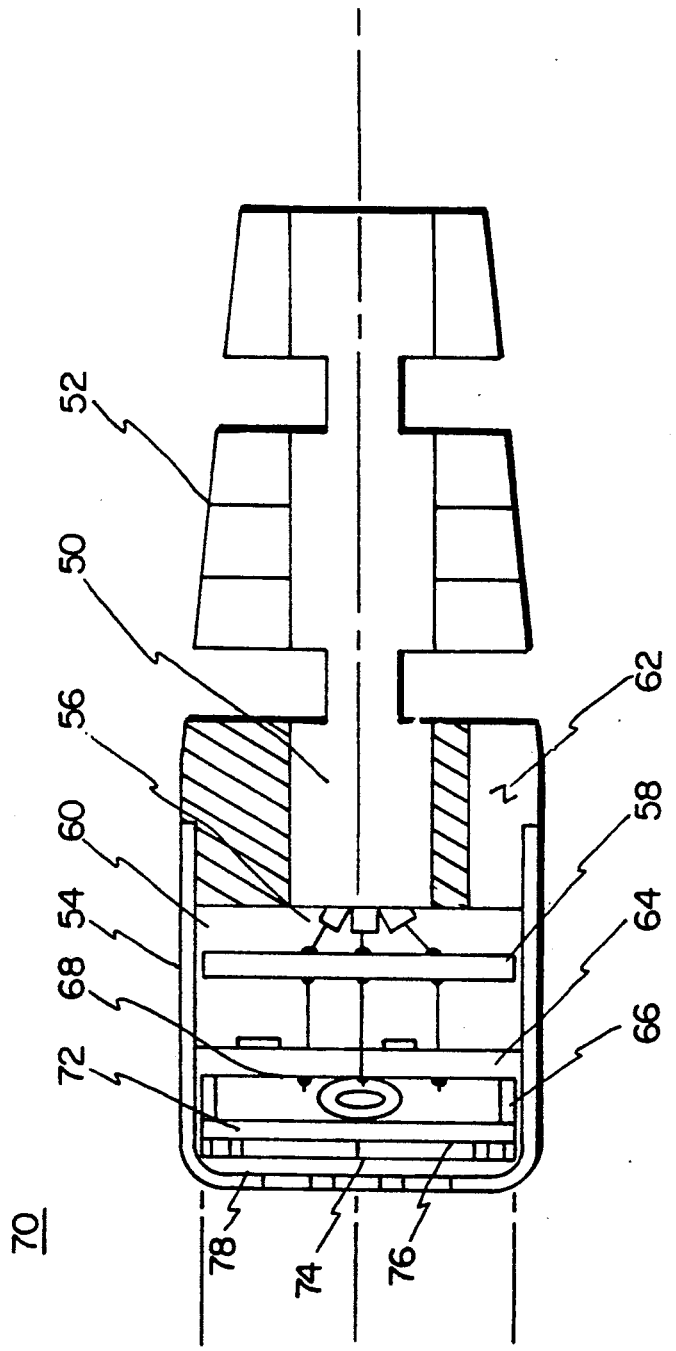
FIG. 3 is a cross-section view of one model of a miniaturized microphone within which the circuit of the present invention may be mounted.

Referring now to FIGS. 1 and 2, first, second and third preferred embodiments of the audio frequency amplification circuit of the present invention are depicted in relation to an electret signal source of the type depicted in FIG. 3. As is known in the prior art, the circuits of FIGS. 1 and 2 convert and preamplify the change in electrostatic charge effective across the electret electrodes as a result of sound pressure waves impinging upon and distorting a flexible diaphragm. The change in capacitance and the electrostatic charge is converted and amplified by the amplification circuits of FIGS. 1 and 2 from a voltage to a current at near to, but less than, unity voltage gain. As is well known in the art, the circuit components of the embodiments of FIGS. 1 or 2 are mounted within the microphone body in close proximity to the back plate of the electret as shown, for example, in FIG. 3.

In FIGS. 1 and 2, electret signal source is illustrated figuratively as the element 10. The film electrode or capacitive plate borne by the flexible diaphragm is denoted as 12 and the fixed back plate electrode is denoted as element 14. The first electrode or output terminal 12 of the signal source 10 is coupled directly to the gate terminal 18 of FET 16. The other output terminal 14 of signal source 10 is coupled directly to the ground terminal or pole 24 of DC power source B+ which has its positive pole coupled to terminal 26.

The positive pole of the power source B+ coupled to terminal 26 is coupled directly to the drain terminal of FET 16, and the ground pole of the power source B+ coupled to terminal 24 is also coupled to the load resistor 28 and the first and second impedance networks through first bias resistor 32. A signal output terminal 30 is connected to the junction of load resistor 28 and FET source terminal 22. This basic configuration of a FET amplifier operating as a source follower is well known in the prior art as exemplified by the references cited in the description of the prior art.

In contrast to the prior art, the audio frequency amplification circuit of the present invention employs a first and second impedance network comprising the elements 30, 34 and 36, 38, 40, respectively, in the embodiment of FIG. 1 with the additional capacitive elements 42 and 44 depicted as alternatives dependent upon the resistance of resistors 30 and 34. The first impedance network comprises the resistors 30 and 34 which provide a floating bias point junction 33 which is a fraction of the power source B+ voltage. This bias point varies with applied voltage and provides a reference point for the second impedance network which in effect couples this bias point voltage to the gate 18 of FET 16 and the first output terminal 12 of the signal source 10.

The second impedance network of the embodiment of FIG. 1 comprises the high impedance resistor 36 and the parallel, oppositely-oriented diodes 38 and 40 coupled between the bias point 33 and the gate 18. This second, high impedance, feedback network provides the discharge path for gate capacitance-retained potentials which increase in severity with the amplitude of the signal generated by the signal source 10. The amplitude of the signal generated by the signal source 10 is proportional to the amplitude of sound waves impinging upon the diaphragm of the electret microphone The opposite polarity, parallel diodes 38 and 40 bleed off the gate leakage current through the high impedance resistor 36 and the bias point 33 and resistor 30 to ground potential. At high input signal levels, the gate-to-source DC impedance degrades until, in the extreme case, it will fall from gigo-ohms to only a few hundred ohms. Heavy distortion at high input signal levels may be avoided by placing a very high impedance biasing resistor between the gate and source as suggested in the Nakamura article, but such a high impedance alone would introduce noise at higher audio frequencies. For example, as shown in FIG. 16 of the Nakamura article, despite increasing the gate-to-source impedance from 2.2 mega-ohm to 250 mega-ohm, noise at frequencies in excess of 1,000 Hz. continues to increase through 20,000 Hz.

In accordance with the present invention, it has been found that such noise can be alleviated by the combination of a very high impedance resistor 36 and the parallel, oppositely-poled diodes 38 and 40 of the second high impedance biasing network.

The improvement of the present invention is the combination of two existing circuit elements in a manner which overcomes their separate limitations. The two resistor biasing network 32, 34 sets the gate potential, but when used alone decreases the effective input resistance over that of a single resistor and increases the noise. The two diodes 38, 40 present a higher input impedance than is practical with discrete resistors but has an overload problem at high signal levels because of the diodes forward conductance at potential differences much over a few hundred millivolts. Attaching the diodes 38, 40 to the bias resistors 32, 34 through a 1-2.5 giga-ohm resistor 36 solves these problems. At low signal levels the impedance of the diodes should take precedence and decrease the noise. At high signal levels, the impedance of the diodes should drop, but the impedance of the series giga-ohm resistor 36 prevents the input impedance from degrading sufficiently to cause noticeable distortion. Any noise increase would occur only at high signal levels and would be masked by these levels. To some extent it could be said that the circuit reduces the noise level when it might interfere with quiet sounds.

The biasing resistors 32 and 34 may be selected in a range from a relatively low resistance of about 10 Kohms in the first embodiment to an intermediate resistance of up to about 300 megohms in the second embodiment. The values of resistors 32 and 34 need not be equal, but are selected to properly bias FET 16, depending upon its characteristic pinch off voltage. In the low resistance range more current is drawn by the first biasing network, but the noise contribution is minimal as long as the high impedance resistor 36 is present. The only drawback to the FIG. 1 embodiments described to this point may be that the capacitance of the diodes 38, 40. which effectively shunts their effective resistance, allows the noise of the giga-ohm resistor 36 to leak through at low signal levels. This problem is relieved by the use of a very small shunting capacitor 42 or 44 across the giga-ohm resistor 36 or across resistors 36 and 32, respectively, a capacitor so small it may be produced by suitable lead placement. When the values of the resistors 32 and 34 are in the low resistance range, the shunt capacitor 42 suffices. However, when the values of resistors 32 and 34 are in the intermediate resistance range, the shunt capacitor 44 suffices to trap that noise.

Referring now to FIG. 2, a further embodiment of the present invention is schematically illustrated wherein the high impedance of the capacitor 36 is incorporated into the first impedance network. In this embodiment resistors 32 and 34 are selected in the giga-ohm range (e.g., 2 giga-ohms each), and the parallel capacitance 46 is formed across the resistor 32. Current drawn by the two impedance networks is extremely low compared to the embodiments of FIG. 1.

The parallel capacitive elements 42, 44 or 46 may preferably be effected by the layout of the resistors, conductors, and diodes on the circuit board of the microphone assembly of FIG. 3 so as to intentionally create picofarad range parasitic capacitances. Alternatively, the circuit may be altered to include discrete picofarad range capacitors in the positions depicted in FIGS. 1 or 2.

The components of FIGS. 1-2 and their values are identified as follows:

| Element Number | Identification of Element | Value or Range of Values |
| --- | --- | --- |
| B+ | Power source | 0.9-30 v |
| 10 | Electret | 3 pf |
| 16 | JFET | Siliconix 2N4338 or equivalent |
| 28 | Load resistor | 40 K-125 K |
| 32 | Biasing resistor | 10 K-6.0 G |
| 34 | Biasing resistor | 10 K-6.0 G |
| 36 | Biasing resistor | 1-2.5 G |
| 38, 40 | Diode | IN914 or IN916 equivalents |
| 42 | Capacitor | 1 pF |
| 44 | Capacitor | 1 pF |

It is preferable that a JFET with very low pinch off voltage is employed as FET 16. A low pinch off JFET with equal bias resistors 32, 34 places the gate 18 and source 22 voltages approximately midway between the supply rails. This symmetric placement of the bias point is then independent of the power supply and it allows use of the amplifier with single cell supplies.

It is also preferred that the diodes 38, 40 have very low capacitance and very low leakage current. This is best achieved by making the 1N914 or 1N916 diode equivalents as small in surface area as possible. When the diodes and JFET are integrated on a common die, their linear and area dimensions may be reduced by factors of 3 and 10, respectively, reducing shunt capacitance to about 0.1-0.1 pf and leakage current to a fraction of a picoamp.

Referring now to FIG. 3, a miniaturized electret lapel microphone model in which the improved audio frequency amplifier circuits of the present invention may be incorporated is depicted in cross-section. The microphone is cylindrical with a maximum outside diameter of about 0.2 inches and is adapted to be connected to an electrical cord (not shown) fitted within the cavity 50 of the stress-relief extension 52 of the housing 54. The electrical connections of the three wire cord are shown in the area 56 in order to illustrate how the cord would be attached to the terminal board 58. The extension 52 and terminal board 58 are mechanically attached to the housing 54 by glue fillets as is shown, for example, at 60. A port 62 is optionally provided in the extension 52 in order to make the microphone directional.

The audio amplifier circuit components of FIGS. 1 or 2 are mounted on the surface of printed circuit board 64 on the side extending away from the electret assembly 70 and they're electrically coupled to feed-throughs in the terminal board 58 for connection with the electrical cord. The printed circuit board 64 is separated from the electret assembly 70 by gap spacer 66 and the flexible conductive rubber "doughnut" 68 which electrically contacts the fixed back plate 72 and the gate 18 of FET 16.

The electret assembly 70 comprises the fixed back plate 72, the diaphragm ring assembly 74 and the ring-shaped Kapton TM spacer element 76. The spacer element 76 spaces the diaphragm ring assembly 74 from the back plate near the periphery of each element. The diaphragm ring assembly 74 comprises a polarized diaphragm, bearing a conductive film layer, stretched over a ring element so that sound passing through the front screen 78 of the housing 54 and impinging upon the flexible diaphragm deflects it, thus changing the capacitance between the conductive film layer and the back plate and disturbing the charge of the nonconductive diaphragm layer to generate an electrical signal proportional in amplitude to the amplitude of the sound wave and changing at a frequency proportional to the frequency of the sound wave. The diaphragm is electrically connected to the conductive housing 54 which is at ground potential (24 in FIGS. 1 and 2). Thus, the diaphragm corresponds to element 14 and the backplate 72 corresponds to element 12, both depicted in FIGS. 1 and 2.

The construction and operation of electret microphones is well known in the art and the microphone of FIG. 3 is illustrative of one form in which the audio frequency amplifier circuit of the present invention may be incorporated. In this regard, it should be noted that the inventive low-noise audio frequency circuit of the present invention and its operating characteristics and enhanced performance are in no way dependent upon any particular mechanical design of the electret microphone in which it is incorporated. Conversely, the electrical design of the amplifier as described in connection with FIGS. 1 and 2 allows the mechanical design of the electret microphone and its housing to be miniaturized and optimized for a wide variety of applications. Thus, the electret microphone mechanical design of FIG. 3 is to be viewed as merely one application of the inventive circuit.

Although the audio frequency amplifier of the present invention has been described in connection with an electret microphone, it will be understood that it may advantageously be employed in conjunction with a condenser microphone or other transducers for converting audio frequency sound pressure waves into electrical signals.

For example, although the audio frequency amplifier circuit of the present invention may operate with a low voltage source from 0.9 volts to 1.7 volts, it can also be used with higher voltage sources up to 30 volts. Its usefulness with low voltage sources is to be viewed as a benefit rather than a limitation of its capabilities.

Further, as technological advances are made, for example, in developing practical, small-size, low-cost semi-conductor components, and electret or other transducer microphones, the principles of the invention may be applied directly to or employed with such advances to provide high gain, low noise amplification.

Although presently preferred embodiments of the invention have been described, it will be apparent from that description to those skilled in the field to which the invention pertains, that variations of the present embodiments may be implemented without departing from the principles of the invention.

Accordingly, it is intended that the invention be limited not by the structural or functional elements of the described embodiments, but only as set out in the appended claims.

What is claimed is:

1. An audio frequency amplification circuit for use with a low level, high impedance, signal source comprising:
    a field effect transistor having one terminal connected to one pole of a power source, a second terminal connected to one side of a bias means, and a third terminal;
    a load impedance connecting said third terminal to the other pole of said power source;
    a signal source having one output terminal connected to said second electrode of said transistor and another output terminal connected to said other side of said power source; and
    bias means coupled to said power source terminals and said second electrode of said transistor for providing a high dynamic range of amplification of signals generated by said signal source without introduction of noise or distortion comprising:
    a first impedance network coupled between said first and second terminals of said power source for providing a bias point between ground and said power source voltage; and
    a second impedance network coupled between said second electrode of said transistor and said bias point comprising at least two diodes connected in parallel, said diodes being respectively connected with polarities to pass current in relatively opposite directions.

2. The audio frequency amplification circuit of claim 1 wherein second impedance network further comprises a high impedance resistor having a resistance in the giga-ohm range coupled in series with said parallel connected diodes.

3. The audio frequency amplification circuit of claim 2 wherein said first impedance network possesses a resistance in the kilohm range and said second impedance network further comprises capacitance means coupled across said high impedance resistor for improving noise characteristics of said amplification circuit caused by the high impedance of said second impedance network.

4. The audio frequency amplification circuit of claim 3 wherein said signal source is capacitive in nature exhibiting extremely low source capacitance and said capacitance means has a capacitance smaller than the capacitance of said signal source.

5. The audio frequency amplification circuit of claim 1 wherein said signal source comprises an electret microphone transducer.

6. The audio frequency amplification circuit of claim 5 wherein second impedance network further comprises a high impedance resistor having a resistance in the giga-ohm range coupled in series with said parallel connected diodes.

7. The audio frequency amplification circuit of claim 3 wherein said first impedance network possesses a resistance in the megohm range and said second impedance network further comprises capacitance means coupled across said high impedance resistor and to said second terminal of said power source for improving noise characteristics of said amplification circuit caused by the relative impedances of said first and second impedance networks.

8. The audio frequency amplification circuit of claim 1 wherein said first impedance network comprises first and second resistors having resistances in the giga-ohm range coupled in series to provide said bias point at their common connection and capacitance means coupled between said bias point and said second terminal of said power source for improving noise characteristics of said amplification circuit caused by the high impedance of said first impedance network.

9. The circuit of claims 7 or 8 wherein said signal source is capacitive in nature exhibiting extremely low source capacitance and said capacitance means has a capacitance smaller than the capacitance of said signal source.

10. The audio frequency amplification circuit of claims 7 or 8 wherein said signal source comprises an electret microphone transducer.

* * * * *